(12) United States Patent
Goodman

(10) Patent No.: US 12,176,428 B2
(45) Date of Patent: Dec. 24, 2024

(54) CADMIUM SELENIDE-INDIUM ARSENIDE HETEROJUNCTION BIPOLAR TRANSISTOR

(71) Applicant: The United States of America, as represented by the Secretary of the Navy, Crane, IN (US)

(72) Inventor: Kevin D. Goodman, Ellettsville, IN (US)

(73) Assignee: The United States of America, Represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 17/684,712

(22) Filed: Mar. 2, 2022

(65) Prior Publication Data
US 2023/0282734 A1 Sep. 7, 2023

Related U.S. Application Data

(60) Provisional application No. 63/155,909, filed on Mar. 3, 2021.

(51) Int. Cl.
| | |
|---|---|
| *H01L 29/737* | (2006.01) |
| *H01L 29/267* | (2006.01) |
| *H01L 29/36* | (2006.01) |
| *H01L 29/45* | (2006.01) |

(52) U.S. Cl.
CPC ........ *H01L 29/7371* (2013.01); *H01L 29/267* (2013.01); *H01L 29/36* (2013.01); *H01L 29/45* (2013.01)

(58) Field of Classification Search
CPC ....... H01L 29/26; H01L 29/267; H01L 29/36; H01L 29/45; H01L 29/7371
See application file for complete search history.

(56) References Cited

U.S. PATENT DOCUMENTS

| | | | | |
|---|---|---|---|---|
| 7,829,917 | B1 * | 11/2010 | Thomas | H01L 29/0692 |
| | | | | 257/197 |
| 2008/0116465 | A1 * | 5/2008 | Moon | H01L 33/0004 |
| | | | | 257/E33.044 |
| 2012/0068157 | A1 * | 3/2012 | Kub | H01L 29/7376 |
| | | | | 977/734 |

* cited by examiner

*Primary Examiner* — Yara B Green
*Assistant Examiner* — Christopher M Roland
(74) *Attorney, Agent, or Firm* — Naval Surface Warfare Center, Crane Division; Christopher Feigenbutz

(57) ABSTRACT

Provided is a cadmium selenide-indium arsenide heterojunction bipolar transistor. The device includes a first layer comprising a collector of the transistor made of n-type cadmium selenide, a base layer containing indium arsenide, and an emitter layer that reverts to cadmium selenide. The inventive device includes a large neutron cross section via the cadmium selenide layer. The cadmium selenide layer holds a high reaction rate with neutrons thus altering the electrical signal of the HBT in a neutron environment. The inventive HBT also yields higher gains than current homojunction bipolar transistors, such as those utilizing pure indium arsenide or silicon.

10 Claims, 2 Drawing Sheets

CADMIUM SELENIDE-INDIUM ARSENIDE HETEROJUNCTION BIPOLAR TRANSISTOR

CROSS-REFERENCE TO RELATED APPLICATIONS

The present application claims priority to U.S. Provisional Patent Application Ser. No. 63/155,909, filed Mar. 3, 2021, entitled "Cadmium Selenide-Indium Arsenide Heterojunction Bipolar Transistor," the disclosure of which is expressly incorporated by reference herein.

STATEMENT REGARDING FEDERALLY SPONSORED RESEARCH OR DEVELOPMENT

The invention described herein may be manufactured, used and licensed by or for the United States Government for any governmental purpose without payment of any royalties thereon. This invention (Navy Case 210061US02) is assigned to the United States Government and is available for licensing for commercial purposes. Licensing and technical inquiries may be directed to the Technology Transfer Office, Naval Surface Warfare Center Crane, email: Cran_CTO@navy.mil.

FIELD OF THE INVENTION

The field of invention relates generally to transistors. More particularly, it pertains to a cadmium selenide-indium arsenide heterojunction bipolar transistor constructed of materials that yield a high signal gain and that have a high neutron cross section allowing for sensitivity to neutron detection.

BACKGROUND

Heterojunction Bipolar Transistors (HBTs) are types of bipolar junction transistors that utilize differing semiconductor materials for the emitter and base regions, thus forming a heterojunction. HBTs can handle signals of very high frequencies, up to several hundred GHz. HBTs are commonly used in modern ultrafast circuits, including radio-frequency (RF) systems, and in applications requiring a high power efficiency, such as RF power amplifiers in cellular phones.

Common HBTs that are currently known are constructed of indium gallium arsenide paired with gallium arsenide. Alternatively, aluminum gallium arsenide can be paired with gallium arsenide. These devices, however have a small neutron cross section. As can be appreciated, an HBT constructed of a material with a large neutron cross section would be desirable as its sensitivity to neutron interaction yields a high responsivity.

SUMMARY OF THE INVENTION

The present invention relates to a cadmium selenide-indium arsenide heterojunction bipolar transistor. The inventive device provides distinct advantage over the HBTs known and disclosed in the art by containing a large neutron cross section via the cadmium selenide layer. The cadmium selenide layer with its high neutron capture cross-section has the capacity to detect neutrons impingent upon the device. The inventive device also yields higher gains than current homojunction bipolar transistors, such as those utilizing pure indium arsenide or silicon.

According to an illustrative embodiment of the present disclosure, it is an object of the invention to provide a cadmium selenide-indium arsenide heterojunction bipolar transistor.

According to a further illustrative embodiment of the present disclosure, it is an object of the invention to provide an HBT with a large neutron cross section via the cadmium selenide.

According to a yet another illustrative embodiment of the present disclosure, it is an object of the invention to provide an HBT with a cadmium selenide layer that reacts to neutron irradiation impingent upon the device, thus demonstrating usefulness as a solid state neutron detector.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which.

DETAILED DESCRIPTION OF THE DRAWINGS

The embodiments of the invention described herein are not intended to be exhaustive or to limit the invention to precise forms disclosed. Rather, the embodiments selected for description have been chosen to enable one skilled in the art to practice the invention.

Generally, the inventive HBT device includes a first layer comprising the collector of the transistor made of n-type cadmium selenide, a base layer containing indium arsenide, and an emitter layer that reverts to cadmium selenide. One non-limiting novelty of the inventive device resides in the materials being utilized; particularly cadmium selenide and indium arsenide. These materials are atomically lattice matched, which is a fundamental requirement for construction of a heterojunction bipolar transistor. Additionally, the electron energy bands of the materials reside relative to each other in a manner that yields high current gains in a device constructed of the materials. Further, the cadmium layer has a high neutron cross section. The high neutron cross section allows detection of neutron irradiation upon the device by neutron interaction altering the electrical behavior of the HBT.

In one illustrative embodiment, provided is a cadmium selenide-indium arsenide heterojunction bipolar transistor comprising: a first layer comprising an n-type cadmium selenide collector; a second layer comprising a p-type indium arsenide base layer; and a third layer comprising an n-type cadmium selenide emitter layer. In another illustrative embodiment, provided is a cadmium selenide-indium arsenide heterojunction bipolar transistor comprising: a first layer comprising an n-type cadmium selenide collector doped at a concentration of $10^{16}$ cm$^{-3}$; a second layer comprising a p-type or intrinsic indium arsenide base layer doped at a concentration of $10^{15}$ cm$^{-3}$; and a third layer comprising an n-type cadmium selenide emitter layer doped at a concentration of $10^{18}$ cm$^{-3}$; and one or more Ohmic metal contacts. The specifics of the doping levels can be tailored for desired device behavior.

Figure 1:
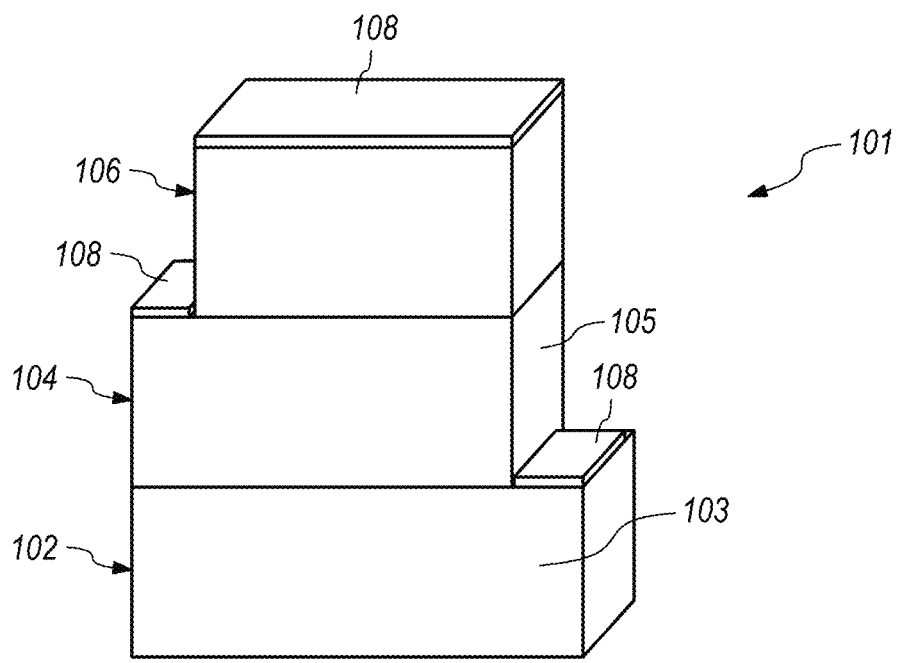
FIG. 1 shows a schematic of the cadmium selenide-indium arsenide heterojunction bipolar transistor.

FIG. 1 shows a schematic of the cadmium selenide-indium arsenide heterojunction bipolar transistor 101. The device is preferably grown epitaxially, which is a type of crystal growth or material deposition in which new crystalline layers are formed with one or more well-defined orientations with respect to the crystalline substrate. The first layer 102 includes the collector of the transistor. The first layer 102 comprises an n-type cadmium selenide 103 doped at a concentration of $10^{16}$ cm$^{-3}$. The base 104 of the transistor contains a p-type or intrinsic indium arsenide 105 doped at a concentration of $10^{15}$ cm$^{-3}$. Epitaxial growth is paramount to ensure a defect free interface between the indium arsenide and the cadmium selenide. The base layer 104 must be large enough to ensure punch through does not occur between the depletion regions that exist on either side of it. The base layer 104 must also be thin enough to allow as many electrons injected from the emitter to pass through the base and arrive at the collector. The final layer of the device, the emitter 106, reverts to n-type cadmium selenide 103 doped at a concentration of $10^{18}$ cm$^{-3}$ n-type. The transistor 101 further comprises metal contacts 108. In an illustrative embodiment, the metal contacts 108 are Ohmic in nature.

Figure 2:
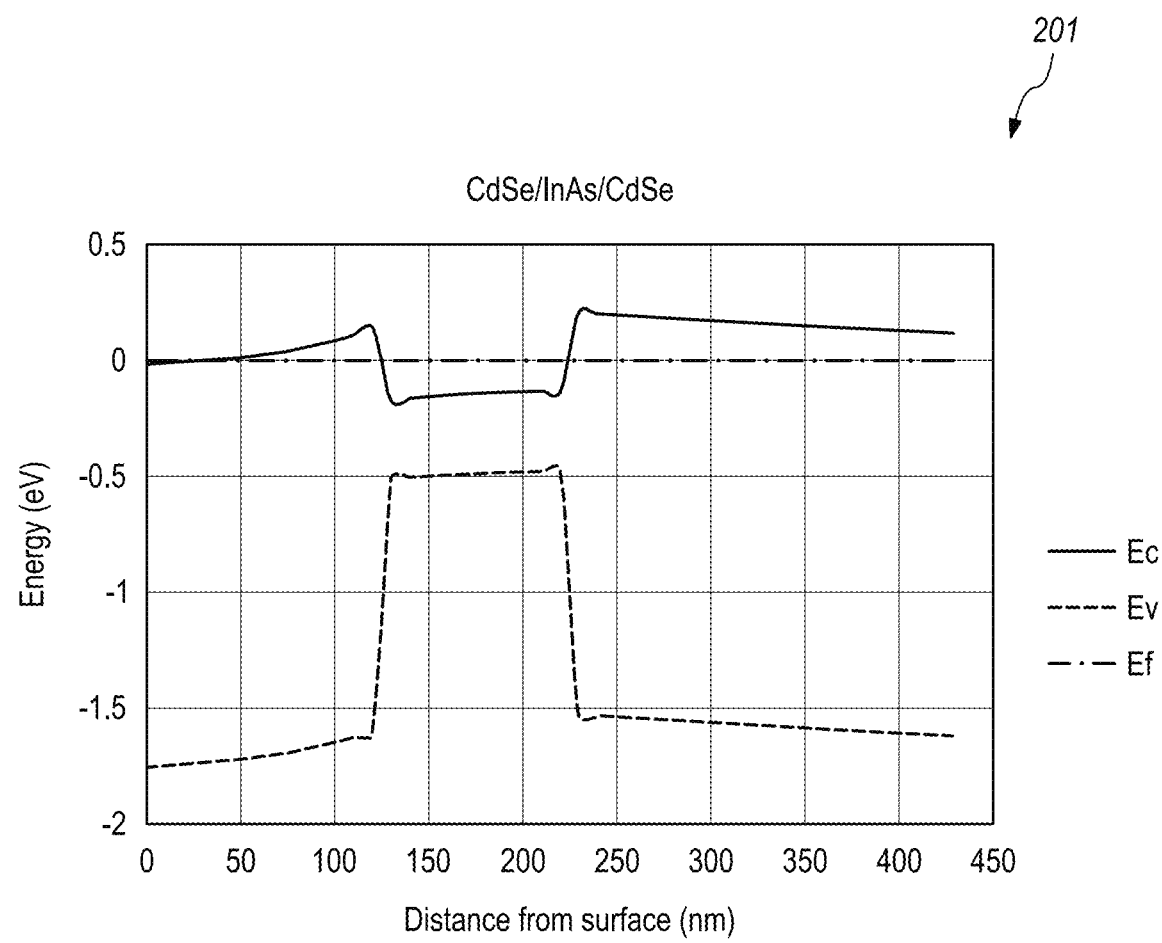
FIG. 2 shows a diagram of the energy band the cadmium selenide-indium arsenide heterojunction bipolar transistor.

FIG. 2 shows a diagram 201 of the energy band the cadmium selenide-indium arsenide heterojunction bipolar transistor. Shown is an energy band diagram 201 with thicknesses of 130/100/200 nm and doping n/p/n of 10/\18/15/16 cm$^{-3}$. Of note is the large valence band offset, which helps reduce hole injection into the emitter. Also shown is the band offset between the base and emitter layers. The large band offset from the valence band traps holes to increase the emitter's injection efficiency. The smaller band gap of the indium arsenide also yields a high current gain for the device. The junctions at the interfaces between emitter/base and base/collector must be of high quality, meaning no atomic defects. The cadmium in the emitter and collector will show sensitivity to neutron irradiation altering the electrical signal of the HBT thus forming a solid state neutron detector. Biasing of the device follows historical HBT definitions to put the device in the desired mode of operation. This knowledge is known in the field.

An advantage of the inventive HBT resides in the materials being utilized; cadmium selenide and indium arsenide. These materials are atomically latticed matched, a fundamental requirement for construction of a heterojunction bipolar transistor. Additionally, the materials' electron energy bands reside relative to each other in a manner that yields high current gains in a device constructed of the materials. Further, the cadmium layer has a high neutron cross section. As can be appreciated, a high neutron cross section will capture impingent neutrons, thus altering the electrical behavior of the device when used in a neutron environment allowing for a sensitive solid state neutron detector.

Although the invention has been described in detail with reference to certain preferred embodiments, variations and modifications exist within the spirit and scope of the invention as described and defined in the following claims.

The invention claimed is:

1. A cadmium selenide-indium arsenide heterojunction bipolar transistor comprising:
   a first layer comprising an n-type cadmium selenide collector doped at a concentration of $10^{16}$ cm$^{-3}$;
   a second layer comprising a p-type indium arsenide base layer; and
   a third layer comprising an n-type cadmium selenide emitter layer.

2. The device of claim 1, wherein said transistor further comprises one or more metal contacts.

3. The device of claim 2, wherein said metal contacts are Ohmic.

4. A cadmium selenide-indium arsenide heterojunction bipolar transistor comprising:
   a first layer comprising an n-type cadmium selenide collector doped at a concentration of $10^{16}$ cm$^{-3}$;
   a second layer comprising a p-type indium arsenide base layer doped at a concentration of $10^{15}$ cm$^{-3}$; and
   a third layer comprising an n-type cadmium selenide emitter layer doped at a concentration of $10^{18}$ cm$^{-3}$; and
   one or more Ohmic metal contacts.

5. A cadmium selenide-indium arsenide heterojunction bipolar transistor comprising:
   a first layer comprising an n-type cadmium selenide collector;
   a second layer comprising a p-type indium arsenide base layer doped at a concentration of $10^{15}$ cm$^{-3}$; and
   a third layer comprising an n-type cadmium selenide emitter layer.

6. The device of claim 5, wherein said transistor further comprises one or more metal contacts.

7. The device of claim 6, wherein said metal contacts are Ohmic.

8. A cadmium selenide-indium arsenide heterojunction bipolar transistor comprising:
   a first layer comprising an n-type cadmium selenide collector;
   a second layer comprising a p-type indium arsenide base layer; and
   a third layer comprising an n-type cadmium selenide emitter layer doped at a concentration of $10^{18}$ cm$^{-3}$.

9. The device of claim 8, wherein said transistor further comprises one or more metal contacts.

10. The device of claim 9, wherein said metal contacts are Ohmic.

* * * * *